(12) United States Patent
Mimura

(10) Patent No.: US 11,387,119 B2
(45) Date of Patent: Jul. 12, 2022

(54) FLUID HEATING DEVICE

(71) Applicant: KELK Ltd., Kanagawa (JP)

(72) Inventor: Kazuhiro Mimura, Kanagawa (JP)

(73) Assignee: KELK Ltd., Kanagawa (JP)

(*) Notice: Subject to any disclaimer, the term of this patent is extended or adjusted under 35 U.S.C. 154(b) by 209 days.

(21) Appl. No.: 16/475,734

(22) PCT Filed: Nov. 14, 2017

(86) PCT No.: PCT/JP2017/040878
§ 371 (c)(1),
(2) Date: Jul. 3, 2019

(87) PCT Pub. No.: WO2018/139011
PCT Pub. Date: Aug. 2, 2018

(65) Prior Publication Data
US 2021/0043470 A1    Feb. 11, 2021

(30) Foreign Application Priority Data

Jan. 26, 2017  (JP) .............................. JP2017-012138

(51) Int. Cl.
  *B08B 3/10* (2006.01)
  *H01L 21/67* (2006.01)
  *H01L 21/02* (2006.01)
(52) U.S. Cl.
  CPC .......... *H01L 21/67023* (2013.01); *B08B 3/10* (2013.01); *H01L 21/02052* (2013.01)
(58) Field of Classification Search
  CPC ......... H01L 21/67023; H01L 21/02052; B08B 3/10
  See application file for complete search history.

(56) References Cited

U.S. PATENT DOCUMENTS

2012/0240958 A1* 9/2012 Higuchi ............ H01L 21/67057
                                                         134/10
2013/0220478 A1* 8/2013 Kasahara .......... H01L 21/67017
                                                         141/2
(Continued)

FOREIGN PATENT DOCUMENTS

CN      202238722       5/2012
CN      204730306      10/2015
(Continued)

OTHER PUBLICATIONS

KR Office Action in Korean Application No. 10-2019-7010712, dated Apr. 17, 2020, 9 pages (with English translation).
(Continued)

*Primary Examiner* — Joseph L. Perrin
*Assistant Examiner* — Irina Graf
(74) *Attorney, Agent, or Firm* — Fish & Richardson P.C.

(57) ABSTRACT

A fluid heating device includes: a tank to store a fluid; a pump to deliver the fluid stored in the tank; a heater to heat the delivered fluid to a predetermined temperature; a return pipe to return the heated fluid to the tank; a fluid supply valve to supply an unheated fluid into the tank; a fluid discharge valve to discharge the heated fluid from the tank; a temperature sensor to detect a temperature of the heated fluid; and a temperature controller to control an opening degree of each of the fluid supply valve and the fluid discharge valve to control the temperature of the fluid stored in the tank. The temperature controller includes: a discharge opening-degree controller-to control the opening degree of the fluid discharge valve; and a supply opening-degree controller to control the opening degree of the fluid supply valve.

5 Claims, 10 Drawing Sheets

(56) References Cited

U.S. PATENT DOCUMENTS

| | | | | |
|---|---|---|---|---|
| 2014/0262199 | A1* | 9/2014 | Kobayashi | G05D 23/1934 165/294 |
| 2016/0071738 | A1 | 3/2016 | Iimori et al. | |
| 2016/0305688 | A1* | 10/2016 | Nakayama | F24H 1/142 |

FOREIGN PATENT DOCUMENTS

| | | |
|---|---|---|
| CN | 205042838 | 2/2016 |
| JP | H03-233258 | 10/1991 |
| JP | H09-196468 | 7/1997 |
| JP | 2000-266496 | 9/2000 |
| JP | 2001-118821 | 4/2001 |
| JP | 2003-042548 | 2/2003 |
| JP | 2010-067636 | 3/2010 |
| JP | 2010-078178 | 4/2010 |
| JP | 2010-139202 | 6/2010 |
| JP | 2016-058482 | 4/2016 |
| JP | 2016-146813 | 8/2016 |
| JP | 2016-156594 | 9/2016 |
| TW | 201437575 | 10/2014 |

OTHER PUBLICATIONS

International Search Report and Written Opinion in International Application No. PCT/JP2017/040878, dated Jan. 30, 2018, 12 pages with English Translation.

CN Office Action in Chinese Application No. 201780066854.1, dated Jul. 9, 2020, 16 pages.

PCT International Preliminary Report on Patentability in International Appln. No. PCT/JP/2017/040878, dated Jul. 30, 2019, 8 pages (English Translation).

TW Office Action in Taiwanese Appln. No. 107100352, dated Feb. 15, 2020, 9 pages (with English translation).

* cited by examiner

FLUID HEATING DEVICE

CROSS-REFERENCE TO RELATED APPLICATIONS

This application claims priority to International Application No. PCT/JP2017/040878 filed on Nov. 14, 2017, which claims priority to Japanese Application No. 2017-012138, filed on Jan. 26, 2017, the contents of which are incorporated herein in their entirety.

TECHNICAL FIELD

The present invention relates to a fluid heating device.

BACKGROUND ART

Typically, a front-end process of a semiconductor manufacturing process includes many steps of cleaning a semiconductor wafer with deionized water heated to a high temperature.

Patent Literature 1 discloses a typical heating method of deionized water in which deionized water supplied at a room temperature is delivered through a heating source to be heated to a target temperature and the heated deionized water is supplied to a cleaning tank.

Patent Literature 1 discloses that a water discharge valve is provided to a pipe for supplying the heated deionized water to the cleaning tank, thereby keeping discharging the heated deionized water.

This method requires the high-temperature deionized water to be kept being supplied even at a non-cleaning period of a semiconductor wafer, for the following reasons.

The first reason is that, if the heating is interrupted, re-heating is required at a next cleaning process, which requires extra time and energy for increasing the temperature.

The second reason is that, if the flow of the deionized water is halted for a long time, live bacteria may be generated in a pipe to cause contamination.

Since the heated deionized water must be discharged in the technique disclosed in Patent Literature 1, energy loss is caused. In order to recover and improve the energy loss, Patent Literature 2 discloses heat exchange between a pipe for a waste liquid after a cleaning process and a deionized water supply pipe.

However, in the technique disclosed in Patent Literature 2, an energy recovery efficiency is low and the unused deionized water for cleaning is also discharged as a waste liquid.

Recently, a lot of high-temperature deionized water have been used for cleaning in many steps of a semiconductor manufacturing process due to an increase in diameter of a semiconductor wafer, an increase in size of a processing tank, and an increase in number of a single wafer cleaner. Accordingly, energy saving and water saving in the steps requiring the high-temperature deionized water have been increasingly demanded.

In response to this demand, there has been proposed a method, which is the same as a cleaning method using chemicals disclosed in Patent Literature 3, including: circulating deionized water while heating the deionized water; storing the deionized water in a tank; and separating only a part of the deionized water required for cleaning from a circulation circuit to draw the part of the deionized water for use. In this method, a non-cleaning period requires the deionized water only to circulate and energy required for heating is smaller than that in a typical method.

CITATION LIST

Patent Literature(S)

Patent Literature 1: JP 2003-42548 A
Patent Literature 2: JP 2000-266496 A
Patent Literature 3: JP 2010-67636 A

SUMMARY OF THE INVENTION

Problem(s) to be Solved by the Invention

However, in the cleaning using the deionized water unlike the cleaning using chemicals, a temperature of the deionized water is sometimes changed depending on usage. In changing the temperature of the deionized water, the technique disclosed in Patent Literature 3 can change a temperature setpoint of the deionized water from a low temperature to a high temperature, but faces difficulty in changing the temperature setpoint of the deionized water from a high temperature to a low temperature since a heat source has no cooling function. The technique disclosed in Patent Literature 3 requires that all the heated deionized water in the tank is disposed and again deionized water at a normal temperature is supplied into the tank and heated. Accordingly, energy saving and water saving cannot be achieved.

An object of the invention is to provide a fluid heating device capable of achieving energy saving and water saving.

Means for Solving the Problem(s)

According to an aspect of the invention, a fluid heating device includes: a tank configured to store a fluid; a pump configured to deliver the fluid stored in the tank; a heater configured to heat the delivered fluid to a predetermined temperature; a return pipe configured to return the fluid heated by the heater to the tank; a fluid supply valve configured to supply an unheated fluid into the tank; a fluid discharge valve configured to discharge the heated fluid from the tank; a temperature sensor configured to detect a temperature of the heated fluid; and a temperature controller configured to control an opening degree of each of the fluid supply valve and the fluid discharge valve to control a temperature of the fluid stored in the tank, in which the temperature controller further includes a discharge opening-degree controller configured to control the opening degree of the fluid discharge valve on a basis of the temperature detected by the temperature sensor; and a supply opening-degree controller configured to control the opening degree of the fluid supply valve on a basis of the temperature detected by the temperature sensor.

In the above aspect of the invention, since the temperature sensor detects the temperature of the heated fluid, the temperature of the heated fluid stored in the tank can be checked when unheated fluid is supplied from the fluid supply valve. Accordingly, unlike a typical method, it is unnecessary to discharge all the heated fluid from the tank, newly store unheated fluid, and heat all the unheated fluid by the heater. Accordingly, energy saving and water saving are achievable.

Moreover, by detecting the temperature of the heated fluid, a decrease in the temperature of the fluid caused by the supply and mix of the unheated fluid to the heated fluid can be checked. Accordingly, the heating by the heater and the discharge amount of the heated fluid can be minimized. Consequently, energy saving and water saving are achievable.

In the above aspect of the invention, the temperature controller preferably includes a supply calculator configured to calculate a supply amount of the unheated fluid for decreasing the temperature of the heated fluid stored in the tank to a temperature setpoint.

In the above aspect of the invention, the fluid discharge valve is preferably provided in the return pipe located downstream of the heater.

In the above aspect of the invention, the fluid heating device preferably includes: a first circulation loop provided with the pump, the heater, and the return pipe; and a second circulation loop independent of the first circulation loop and configured to supply a part of the heated fluid to a cleaner of a semiconductor wafer and return the rest of the part of the heated fluid to the tank, and the fluid discharge valve is preferably provided in the second circulation loop.

BRIEF DESCRIPTION OF DRAWING(S)

FIG. 1 schematically shows a fluid heating device according to a first exemplary embodiment of the invention.

Figure 6:
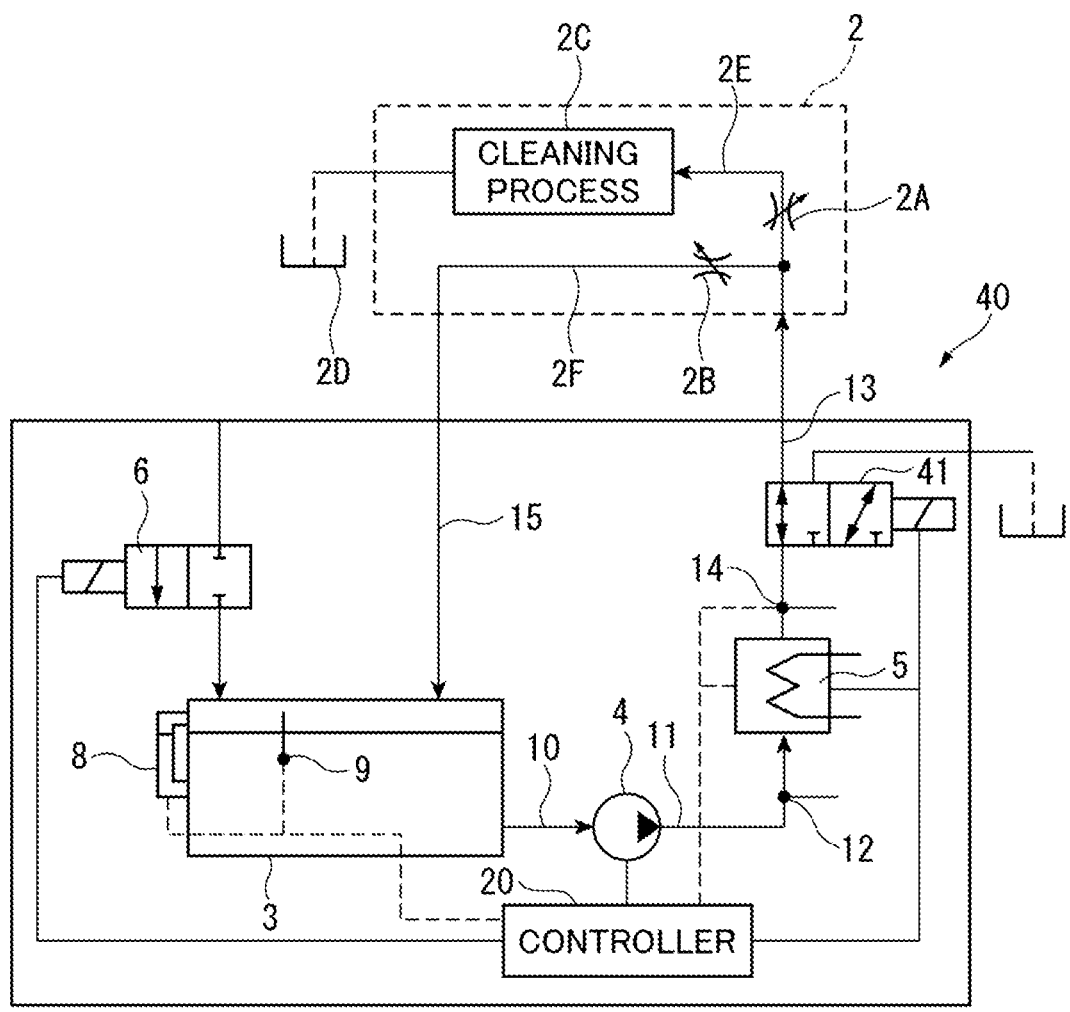

FIG. 6 schematically shows a fluid heating device according to a third exemplary embodiment of the invention.

Figure 7:
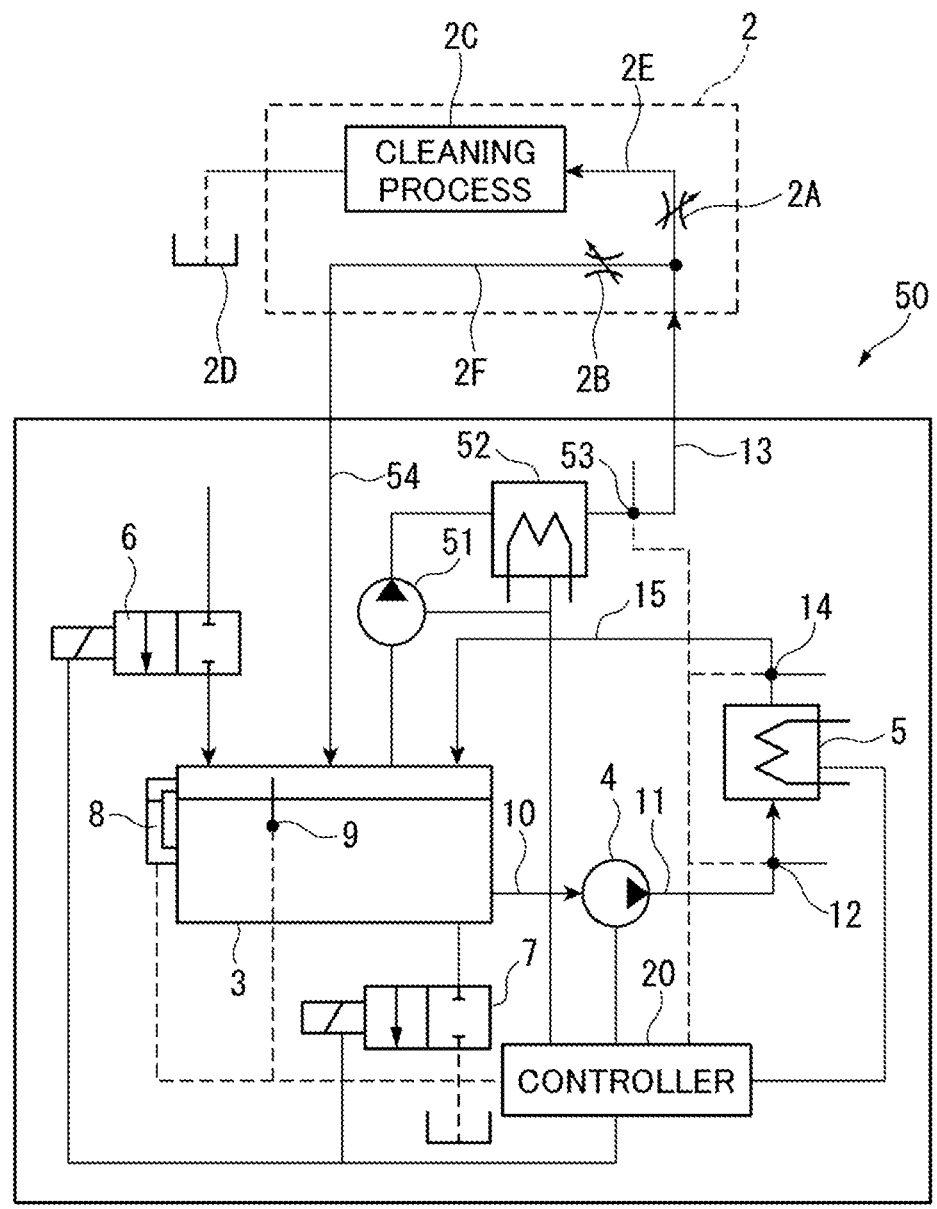

FIG. 7 schematically shows a fluid heating device according to a fourth exemplary embodiment of the invention.

Figure 8:
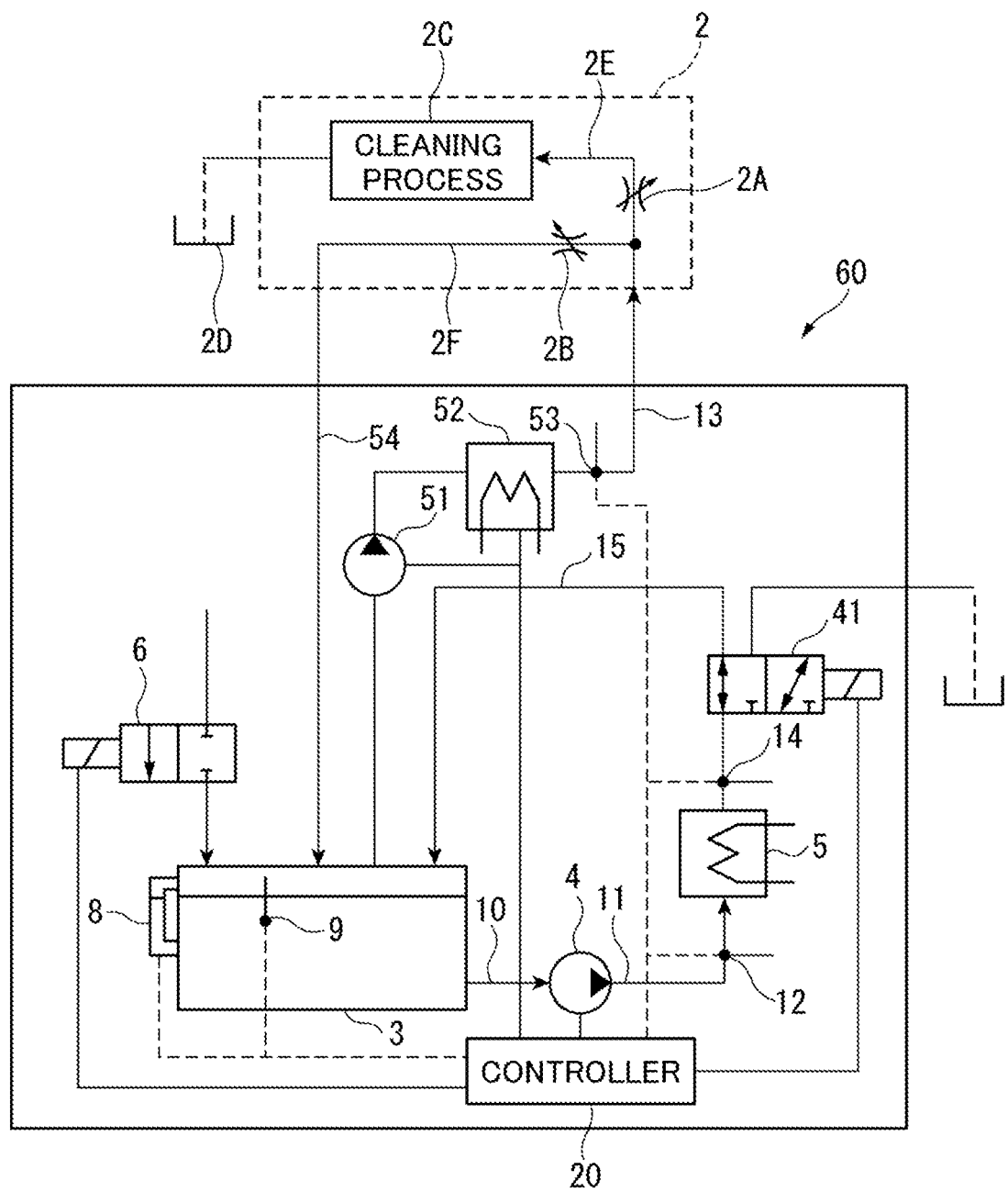

FIG. 8 schematically shows a fluid heating device according to a fifth exemplary embodiment of the invention.

Figure 9:
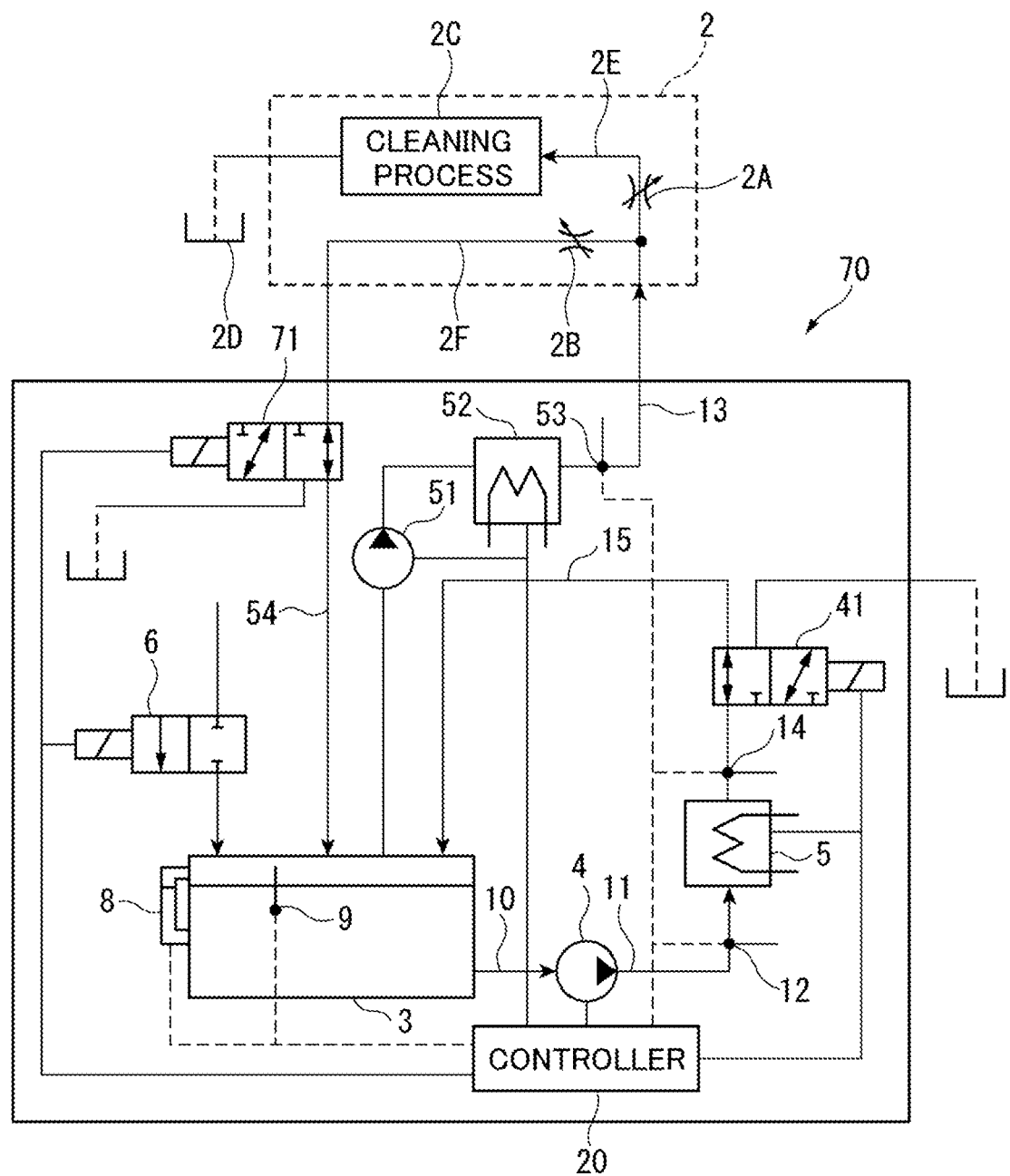

FIG. 9 schematically shows a fluid heating device according to a sixth exemplary embodiment of the invention.

Figure 10:
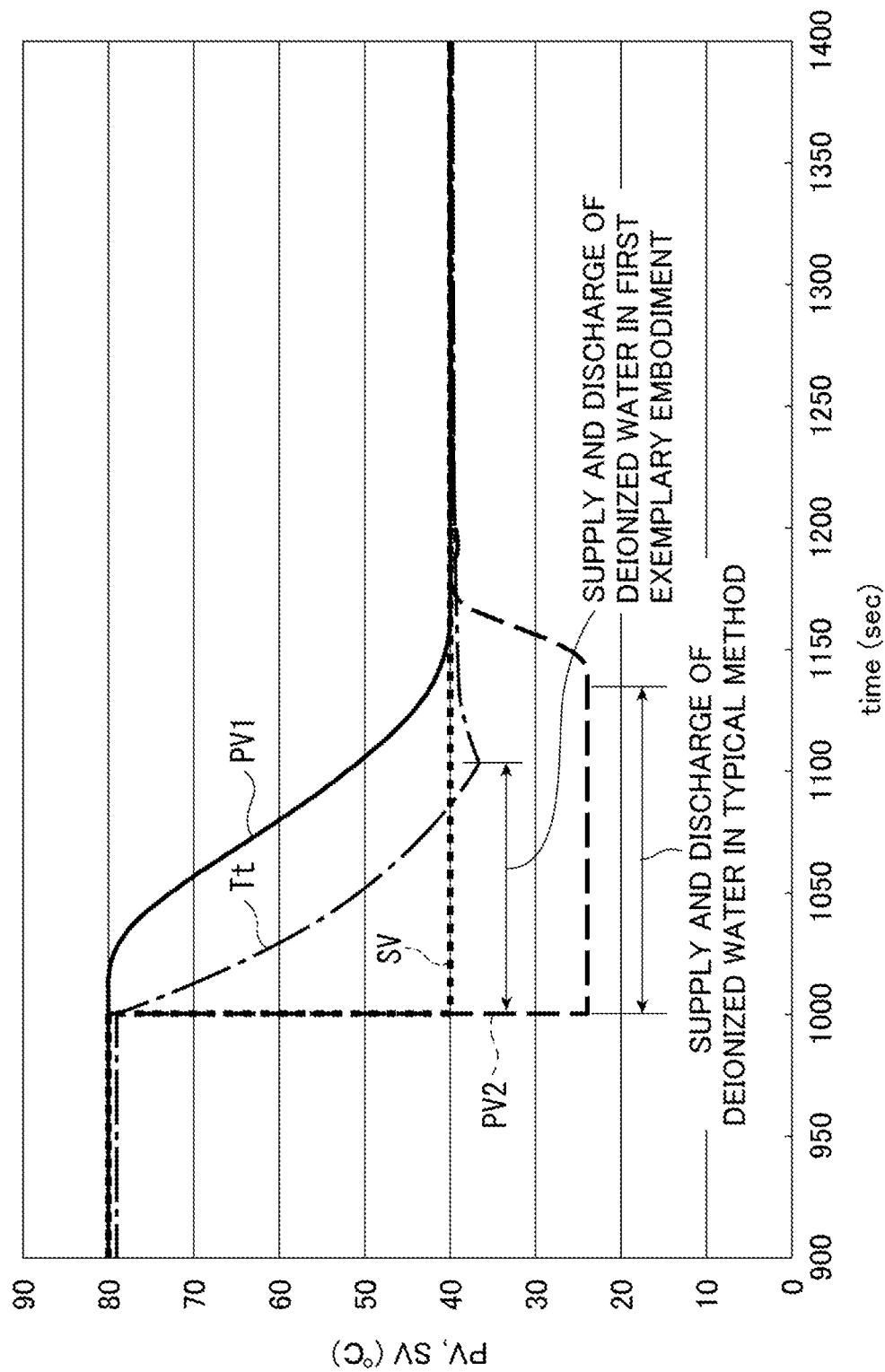

FIG. 10 is a graph showing simulation results of the change in the temperature setpoint in the fluid heating device according to the first exemplary embodiment and a change in a temperature setpoint according to a typical method.

DESCRIPTION OF EMBODIMENT(S)

Exemplary embodiment(s) of the invention will be described below with reference to the attached drawings.

First Exemplary Embodiment

1. Device Structure

Figure 1:
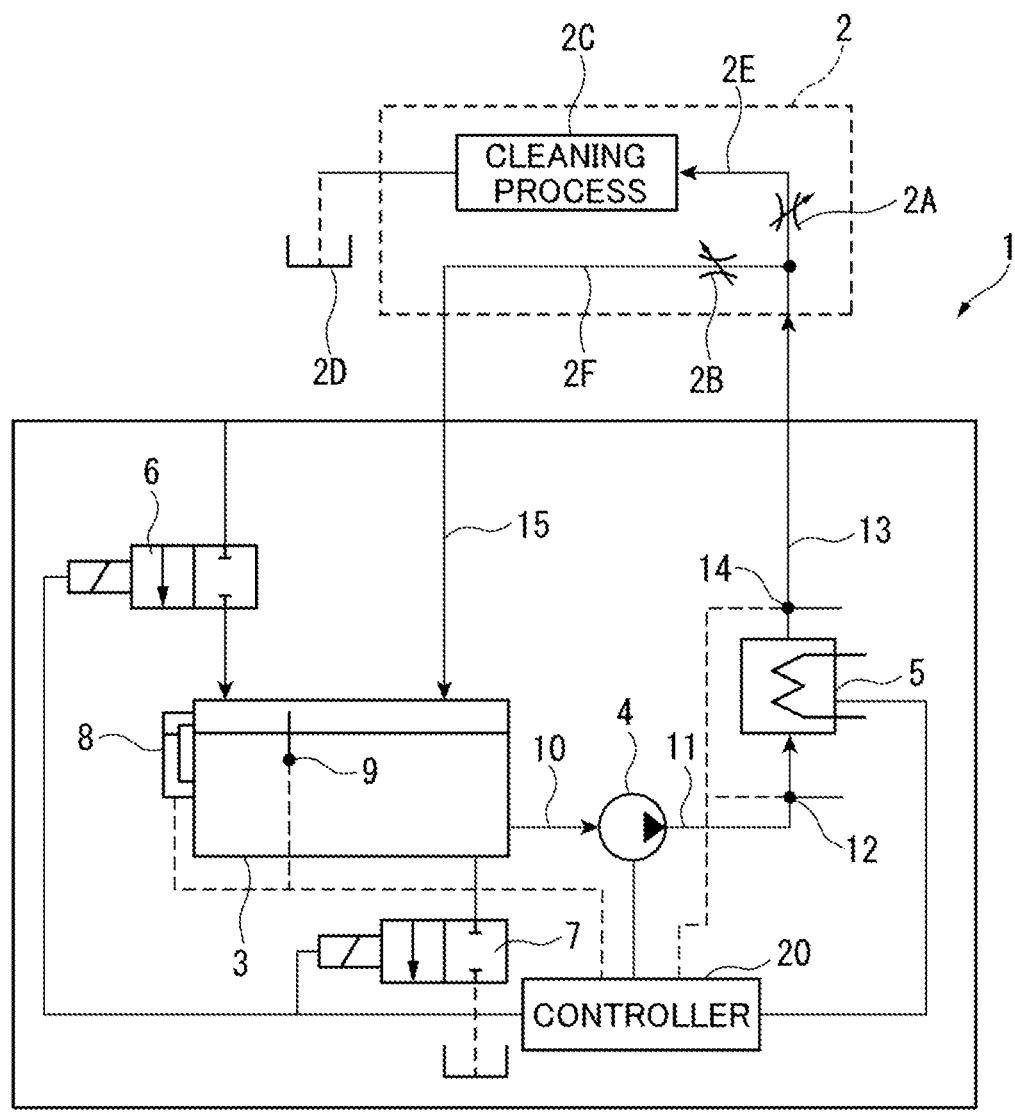
Figure 2:
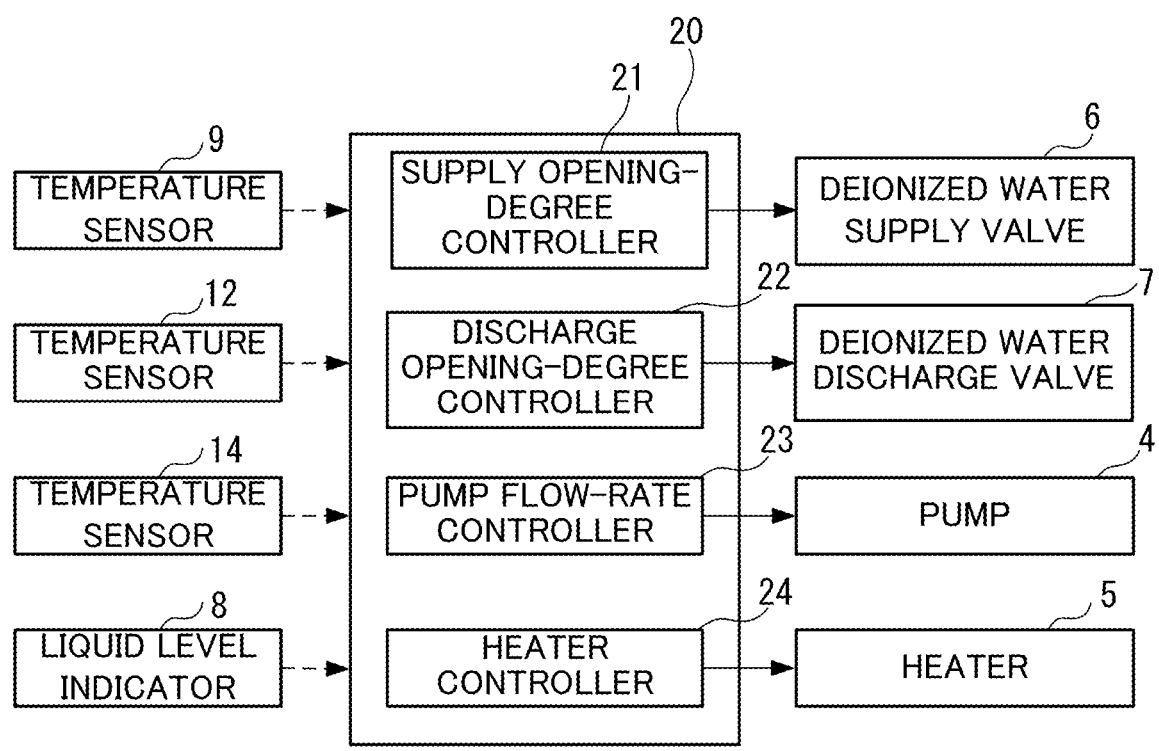
FIG. 2 is a block diagram showing a temperature controller of the fluid heating device according to the first exemplary embodiment.

FIG. 1 shows a structure of a deionized water heating device 1 according to a first exemplary embodiment of the invention.

The deionized water heating device 1 (i.e., a fluid heating device) is configured to supply deionized water (i.e., fluid) heated to a temperature setpoint to a single wafer cleaner 2 that is configured to clean semiconductor wafers one by one.

The cleaner 2 includes flow-rate regulating valves 2A and 2B, a cleaning process 2C, and a discharge tank 2D. The flow-rate regulating valve 2A is connected to the cleaning process 2C through a pipe 2E. The flow-rate regulating valve 2B is provided in a pipe 2F branched from the pipe 2E in which the flow-rate regulating valve 2A is provided, and is connected to a return pipe 15 extending to a tank 3 of the deionized water heating device 1.

The heated deionized water supplied from the deionized water heating device 1 is supplied to the cleaning process 2C while the flow-rate regulating valve 2A is opened and the flow-rate regulating valve 2B is closed. A semiconductor wafer is cleaned in the cleaning process 2C. The deionized water after cleaning the semiconductor wafer is discharged to a discharge tank 2D.

On the other hand, while the flow-rate regulating valve 2A is closed and the flow-rate regulating valve 2B is opened, the heated deionized water is not supplied to the cleaning process 2C but returned to the return pipe 15 extending to the tank 3 of the deionized water heating device 1. Further, adjusting an opening degree of each of the flow-rate regulating valves 2A and 2B also makes it possible to supply a part of the heated deionized water supplied from the deionized water heating device 1 to the cleaning process 2C and return the rest of the part of the heated deionized water to the tank 3 of the deionized water heating device 1.

The deionized water heating device 1 includes the tank 3, a pump 4, a heater 5, a deionized water supply valve 6 (i.e., a fluid supply valve), and a deionized water discharge valve 7 (i.e., a fluid discharge valve).

The tank 3 is a container configured to store unheated deionized water at a normal temperature and the heated deionized water returned through the return pipe 15. The tank 3 is made of quartz glass and a fluorine resin such as polytetrafluoroethylene (PTFE) and perfluoroalkoxyalkane (PFAA).

A liquid level indicator 8 and a temperature sensor 9 are provided to the tank 3. The liquid level indicator 8 is configured to detect a liquid level of deionized water stored in the tank 3. The temperature sensor 9 is configured to detect a temperature of the deionized water stored in the tank 3.

The pump 4, which is connected to the tank 3 through a pipe 10, is configured to pump (deliver) the deionized water out of the tank 3.

The heater 5, which is connected to the pump 4 through a pipe 11, is configured to heat the deionized water pumped by the pump 4. The heater 5 is structured in a quartz-glass-made double pipe. A heating source (e.g., a halogen heater) is provided to an inner pipe of the double pipe. The deionized water is circulated through an outer pipe of the double pipe and heated to a temperature setpoint by the heating source.

A temperature sensor 12 is provided in the middle of the pipe 11 located upstream of the heater 5 and configured to detect a temperature of the deionized water flowing into the heater 5.

A pipe 13 is connected to a downstream side of the heater 5 while being connected to the cleaner 2 for a semiconductor wafer. A temperature sensor 14 is provided to the pipe 13 and configured to detect the temperature of the deionized water heated by the heater 5.

The return pipe 15, which is connected to the pipe 2F of the cleaner 2, is configured to return the deionized water unused for cleaning by the cleaner 2 to the tank 3 for storage.

The pipes 10, 11, 13 and 15 are in a form of a pipe member made of a fluorine resin such as PTFE and PFAA.

The deionized water supply valve 6 in a form of a solenoid valve is provided above the tank 3 and connected to a deionized water supply source (not shown). The deionized water supply valve 6 is configured to be opened and closed to supply unheated deionized water at a normal temperature into the tank 3. Opening and closing of the deionized water supply valve 6 is controlled on the basis of the liquid level of the deionized water stored in the tank 3, which is detected by the liquid level indicator 8 provided in the tank 3, and the temperature of the deionized water stored in the tank 3, which is detected by the temperature sensor 9.

The deionized water discharge valve 7 in a form of a solenoid valve is provided under the tank 3 and configured to discharge the deionized water stored in the tank 3. Opening and closing of the deionized water supply valve 7 is controlled based on the liquid level of the deionized water stored in the tank 3, which is detected by the liquid level indicator 8 provided in the tank 3, and the temperature of the deionized water stored in the tank 3, which is detected by the temperature sensor 9.

The deionized water heating device 1 having the above structure includes a controller 20 as a temperature controller.

The controller 20 is configured to receive detection values from the liquid level indicator 8 and the temperature sensors 9, 12 and 14 and output control commands to the pump 4, the heater 5, the deionized water supply valve 6, and the deionized water discharge valve 7 on the basis of the received detection values. The controller 20 includes a supply opening-degree controller 21, a discharge opening-degree controller 22, a pump flow-rate controller 23, and a heater controller 24.

The supply opening-degree controller 21 is configured to generate a control command for opening and closing the deionized water supply valve 6 on the basis of the detection value by the temperature sensor 9 or temperature sensor 12 and the detection value by the liquid level indicator 8, and output the control command to the solenoid valve as the deionized water supply valve 6.

The discharge opening-degree controller 22 is configured to generate a control command for opening and closing the deionized water discharge valve 7 on the basis of the detection value by the temperature sensor 9 or temperature sensor 12 and the detection value by the liquid level indicator 8, and output the generated control command to the solenoid valve as the deionized water discharge valve 7.

The pump flow-rate controller 23 is configured to generate a control command for adjusting a flow rate of the deionized water pumped from the pump 4 on the basis of temperatures detected by the temperature sensors 9 and 12, and output the generated control command to the pump 4.

The heater controller 24 is configured to control a heating condition by the heater 5 on the basis of a temperature detected by the temperature sensor 14. Specifically, the heater controller 24 controls application of current to the heater 5 in a form of a halogen heater, depending on whether the temperature detected by the temperature sensor 14 reaches the temperature setpoint.

2. Method of Changing Temperature Setpoint of Deionized Water in Deionized Water Heating Device 1

Figure 3:
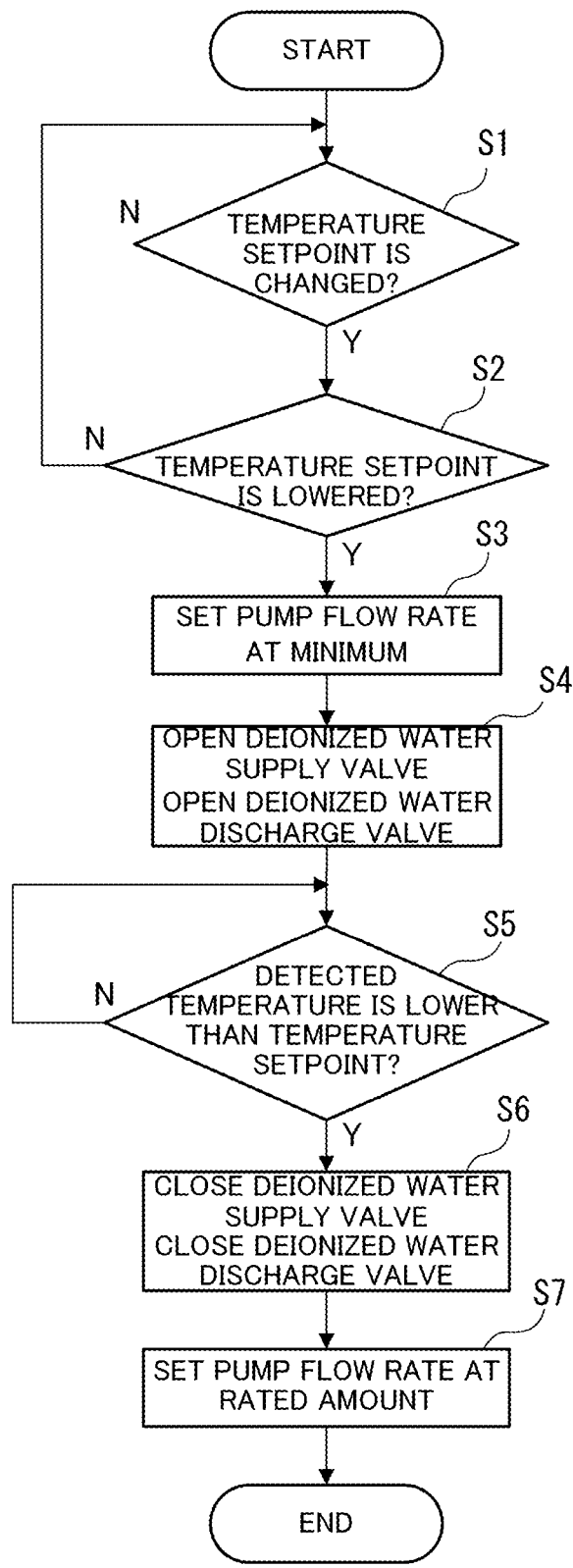
FIG. 3 is a flowchart showing a method of changing a temperature setpoint in the fluid heating device according to the first exemplary embodiment.

Next, a method of changing the temperature setpoint of the deionized water in the deionized water heating device 1 will be described with reference to a flowchart shown in FIG. 3. In the following description, the deionized water heating device 1 is in operation with the flow-rate regulating valve 2A closed and the flow-rate regulating valve 2B opened in the cleaner 2 while the heated deionized water is circulated through the return pipe 15 to the tank 3.

Firstly, the controller 20 monitors whether a temperature setpoint SV1 of deionized water is changed to a temperature setpoint SV2 in response to an operation by an operator (Step S1).

When no change in the temperature setpoint SV1 is found (S1: No), the controller 20 keeps monitoring.

When the temperature setpoint SV1 is changed to the temperature setpoint SV2 (S1: Yes), the controller 20 judges whether the temperature setpoint SV2 is lower than the previous temperature setpoint SV1 (Step S2).

When the temperature setpoint SV2 is higher than the previous temperature setpoint SV1 (S2: No), the heater controller 24 sets a temperature of the heater 5 at the temperature setpoint SV2 and circulates the deionized water in a loop until the detection value of the temperature sensor 14 reaches the temperature setpoint SV2.

When the temperature setpoint SV2 is lower than the previous temperature setpoint SV1 (S2: Yes), the pump flow-rate controller 23 sets an amount of the deionized water pumped by the pump 4 at the minimum amount (Step S3), and the pump 4 circulates the deionized water in a circulation loop at the minimum pumping flow rate. The pump 4 is kept from stopping because bumping of the deionized water in the heater 5 is caused when the amount of the deionized water pumped by the pump 4 becomes zero, and inrush current flows into the heater 5 when the heater 5 is re-started after being completely stopped. If there is no possibility that such conditions occur in the heater 5, the pump 4 may be stopped.

When the amount pumped by the pump 4 becomes the minimum amount, the supply opening-degree controller 21 outputs a control command to open the deionized water supply valve 6, thereby supplying unheated deionized water at a normal temperature through the deionized water supply valve 6. Simultaneously, the discharge opening-degree controller 22 outputs a control command to open the deionized water discharge valve 7, thereby discharging the heated deionized water stored in the tank 3 through the deionized water discharge valve 7 (Step S4).

At this time, a relationship between a temperature Tn of the unheated deionized water at a normal temperature to be supplied through the deionized water supply valve 6 and the temperature setpoint SV2 needs to be SV2>Tn, whereby the temperature of the heated deionized water stored in the tank 3 is gradually lowered.

A relationship between a supply flow rate Qn L/min of the unheated deionized water to be supplied through the deionized water supply valve 6 and a discharge flow rate Qd L/min of the deionized water stored in the tank to be discharged through the deionized water discharge valve 7 desirably satisfies Qn L/min=Qd L/min. The supply opening-degree controller 21 and the discharge opening-degree controller 22 may set the relationship at Qn>Qd when the liquid level is equal to or less than a predetermined threshold with reference to the detection value of the liquid level indicator 8, or may set the relationship at Qn<Qd when the liquid level is equal to or more than the predetermined threshold.

The controller 20 judges whether a detected temperature Tt of the temperature sensor 9 provided in the tank 3, a detected temperature PV of the temperature sensor 14 located downstream of the heater 5, and a detected temperature Tin of the temperature sensor 12 located upstream of the heater 5 are lower than the temperature setpoint SV2 (Step S5). Specifically, for the judgement, the controller 20 uses the detected temperature PV or the detected temperature Tin when the pump 4 is set at the minimum flow rate, and uses the detected temperature Tt when the pump 4 is stopped.

When the detected temperature Tt, Tin or PV is higher than the temperature setpoint SV2 (S5: No), the deionized water supply valve 6 keeps supplying the unheated deionized water at a normal temperature and the deionized water discharge valve 7 keeps discharging the deionized water from the tank 3.

When the detected temperature Tt, Tin or PV is lower than the temperature setpoint SV2 (S5: Yes), the supply opening-degree controller 21 closes the deionized water supply valve 6 and the discharge opening-degree controller 22 closes the deionized water discharge valve 7 (Step S6).

The pump flow-rate controller 23 sets the flow rate pumped by the pump 4 at a rated flow rate and recovers a usual circulation condition (Step S7).

In this condition, since a relationship between the temperature setpoint SV2 and the detected temperatures PV and Tt is represented by SV2>PV>Tt, the heater 5 starts heating and keeps heating until the detected temperature PV reaches the temperature setpoint SV2.

3. Advantage(s) of Exemplary Embodiment(s)

According to the first exemplary embodiment, when the temperature setpoint SV1 is changed to the temperature setpoint SV2 even to satisfy SV1>SV2, the deionized water can be heated to the temperature setpoint SV2 without replacing all of the deionized water stored in the tank 3. Accordingly, the discharge amount of the deionized water from the tank 3 can be reduced to save water.

Moreover, since the unheated deionized water at a normal temperature supplied through the deionized water supply valve 6 is mixed with the heated deionized water in the tank 3 to decrease the temperature of the deionized water, the heater 5 starts heating at the detected temperature PV slightly lower than the temperature setpoint SV2, so that a power consumption by the heater 5 is reducible.

Further, since the unheated deionized water is gradually supplied through the deionized water supply valve 6, a time required until the detected temperature PV reaches the temperature setpoint SV2 after the temperature setpoint SV1 is changed to the temperature setpoint SV2 can be shortened.

Second Exemplary Embodiment

A second exemplary embodiment of the invention will be described below. In the following description, the same portion as already described is denoted by the same reference numeral and the description of the same portion is omitted.

In the first exemplary embodiment, the supply opening-degree controller 21 and the discharge opening-degree controller 22 of the controller 20 simultaneously perform the supply of the unheated deionized water at a normal temperature by the deionized water supply valve 6 and the discharge of the heated deionized water from the tank 3 by the deionized water discharge valve 7.

Figure 4:
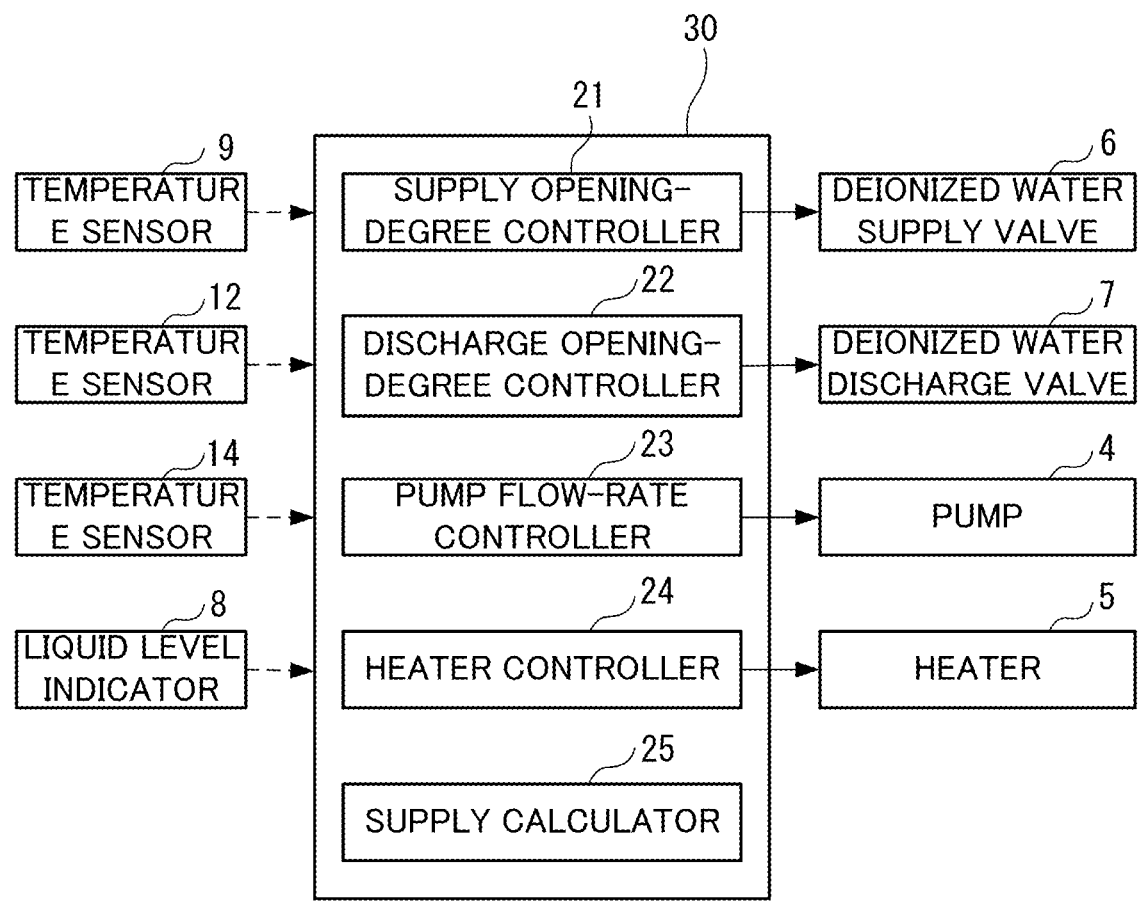
FIG. 4 is a block diagram showing a temperature controller of a fluid heating device according to a second exemplary embodiment of the invention.

However, a controller 30 of the deionized water heating device 1 in the second exemplary embodiment is different from the controller 20 in the first exemplary embodiment in that the controller 30 further includes a supply calculator 25 as shown in FIG. 4. The controller 30 is different from the controller 20 in that the supply calculator 25 calculates the supply amount of the unheated deionized water in advance and that the discharge opening-degree controller 22 discharges the heated deionized water from the tank 3 and sequentially the supply opening-degree controller 21 supplies the unheated deionized water at a normal temperature.

The structure of the deionized water heating device 1 in the second exemplary embodiment is the same as that in the first exemplary embodiment.

On the basis of the changed temperature setpoint SV2, the supply calculator 25 calculates an amount of the heated deionized water stored in the tank 3, in other words, the amount of the unheated deionized water at a normal temperature to be supplied. Specifically, provided that the amount of the heated deionized water stored in the tank 3 is denoted by Vo L, a temperature of the deionized water in the tank 3 is denoted by Th degrees C., a temperature of the unheated deionized water at a normal temperature to be supplied through the deionized water supply valve 6 is denoted by Tc degrees C., the temperature setpoint is denoted by SV2, a discharge amount of the heated deionized water to be discharged from the tank 3 is denoted by Vd L, and a supply amount of the unheated deionized water at a normal temperature to be supplied through the deionized water supply valve 6 is denoted by Vn L, a formula (1) below is satisfied.

Numerical Formula 1

$$SV2 = \frac{Vn \times Tc + (Vo - Vd) \times Th}{Vo - Vd + Vn} \quad (1)$$

Since the supply amount of the deionized water is usually equal to the discharge amount of the deionized water, Vn=Vd is given to provide a formula (2) below.

Numerical Formula 2

$$SV2 = \frac{Vd \times Tc + (Vo - Vd) \times Th}{Vo} \quad (2)$$

The discharge amount Vd of the deionized water in the tank 3 when the temperature setpoint is changed to the temperature setpoint SV2 can be calculated by a formula (3) below based on the formula (2).

Numerical Formula 3

$$Vd = \frac{Vo(Th - SV2)}{Th - Tc} \quad (3)$$

Since it is practically better to set the temperature setpoint at a temperature slightly lower than the temperature setpoint SV2 and finely adjust the temperature using the heater 5, the temperature setpoint is preferably set at SV-ΔT (ΔT>0).

Figure 5:
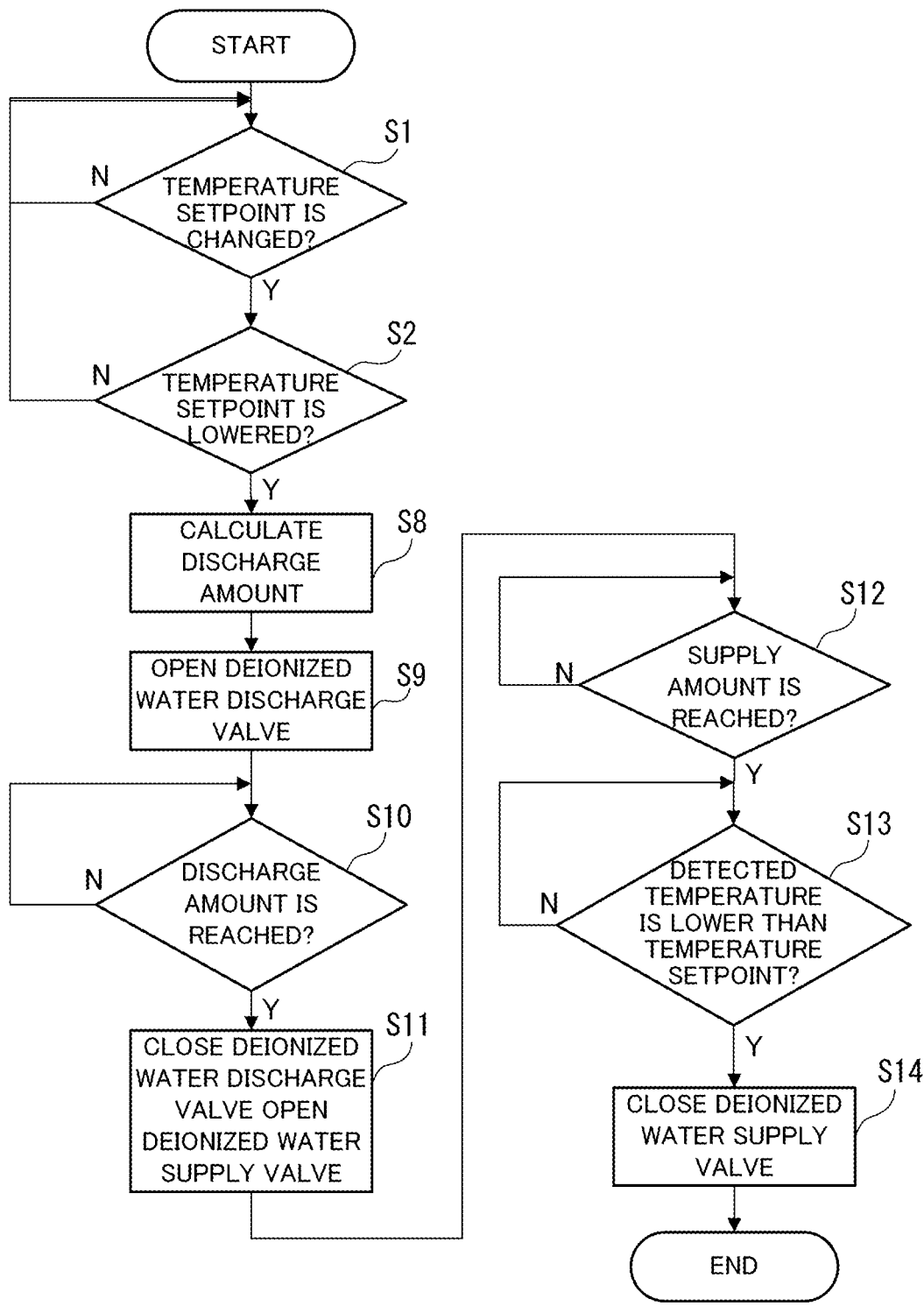
FIG. 5 is a flowchart showing a method of changing a temperature setpoint in the fluid heating device according to the second exemplary embodiment.

The method of changing the temperature setpoint of the deionized water in the deionized water heating device 1 in the second exemplary embodiment is performed with reference to the flowchart shown in FIG. 5. It should be noted that the circulation of the deionized water using the pump 4 in the second exemplary embodiment is omitted.

In the same manner as in the first exemplary embodiment, the change in the temperature setpoint SV1 is monitored (Step S1), and it is judged whether the obtained temperature setpoint SV2 is lower than the previous temperature setpoint SV1 (Step S2).

The supply calculator 25 calculates the discharge amount of the heated deionized water in the tank 3 based on the formula (3) (Step S8).

The discharge opening-degree controller 22 opens the deionized water discharge valve 7 to discharge the heated deionized water from the tank 3 (Step S9).

The discharge opening-degree controller 22 judges whether the discharge amount of the deionized water has reached the discharge amount calculated in Step S8 (Step S10).

When the discharge opening-degree controller 22 judges that the discharge amount of the deionized water has not reached the calculated discharge amount (S10: No), the discharge opening-degree controller 22 keeps the deionized water discharge valve 7 open.

When the discharge opening-degree controller 22 judges that the discharge amount of the deionized water has reached the calculated discharge amount (S10: Yes), the discharge opening-degree controller 22 closes the deionized water discharge valve 7 while the supply opening-degree controller 21 opens the deionized water supply valve 6 (Step S11).

The supply opening-degree controller 21 judges whether the supply amount of the deionized water has reached the supply amount (=discharge amount) calculated in Step S8 (Step S12).

When the supply opening-degree controller 21 judges that the supply amount of the deionized water has not reached the calculated supply amount (S12: No), the supply opening-degree controller 21 keeps the deionized water supply valve 6 open.

Next, the controller 20 judges whether the detected temperature PV by the temperature sensor 14 is lower than the temperature setpoint SV2 (Step S13).

When the detected temperature PV by the temperature sensor 14 is higher than the temperature setpoint SV2 (S13: No), the deionized water supply valve 6 is kept open.

When the detected temperature PV by the temperature sensor 14 is lower than the temperature setpoint SV2 (S13: Yes), the deionized water supply valve 6 is closed.

Subsequently, the heater 5 keeps heating the deionized water until the detected temperature PV reaches the temperature setpoint SV2.

Also in the second exemplary embodiment, the same actions and effects as those in the first exemplary embodiment are obtainable.

Third Exemplary Embodiment

Next, a third exemplary embodiment of the invention will be described below.

The deionized water discharge valve 7 is provided under the tank 3 in the first exemplary embodiment.

A deionized water heating device 40 in the third exemplary embodiment is different from the deionized water heating device in the first exemplary embodiment in that a deionized water discharge valve 41 is provided in the middle of the pipe 13 located downstream of the heater 5 as shown in FIG. 6. The deionized water discharge valve 41 may be provided in the middle of the return pipe 15.

When the temperature setpoint SV1 is changed to the temperature setpoint SV2 lower than the temperature setpoint SV1, the deionized water discharge valve 41 starts to discharge the deionized water while the deionized water supply valve 6 starts to supply the unheated deionized water at a normal temperature, so that the temperature of the deionized water in the tank 3 is gradually lowered.

The rest of the structure of the deionized water heating device 40 and the method of changing the temperature setpoint in the deionized water heating device 40 in the third exemplary embodiment are the same as those in the first exemplary embodiment.

The same method of changing the temperature setpoint of the deionized water from the temperature setpoint SV1 to the temperature setpoint SV2 (SV1>SV2) in the first exemplary embodiment is applicable to the third exemplary embodiment.

Also in the third exemplary embodiment, the same actions and effects as those in the first exemplary embodiment are obtainable.

In addition, since the deionized water discharge valve 41 is provided in such a position, the deionized water flowing in the pipe 13 or the return pipe 15 can be discharged in the middle of the pipe 13 or the return pipe 15. Since the deionized water whose temperature is adjusted by the heater 5 can be discharged, the time for changing from the temperature setpoint SV1 to the temperature setpoint SV2 can be shortened.

Fourth Exemplary Embodiment

Next, a fourth exemplary embodiment of the invention will be described below.

The deionized water heating device 1 in the first exemplary embodiment is structured in a single circulation loop, in which the deionized water flows through the tank 3, the pump 4 and the heater 5 to be heated is supplied through the pipe 13 directly to the cleaner 2, and the deionized water flows through the flow-rate regulating valve 2b in the cleaner 2 to flow in the return pipe 15 and return to the tank 3.

However, a deionized water heating device 50 in the fourth exemplary embodiment is different from the deionized water heating device 1 in the first exemplary embodiment as shown in FIG. 7 in that the deionized water heating device 50 includes: a first circulation loop provided with the pump 4, the heater 5, and the return pipe 15; and a second circulation loop independent of the first circulation loop and including a pump 51, a heater 52, a temperature sensor 53, the pipe 13, the cleaner 2, and a return pipe 54.

Rotation speeds of the respective pump 4 and pump 51 can be simultaneously changed. When the temperature setpoint is changed, the controller 20 changes both of the amounts pumped by the pumps 4 and 51 to the minimum amount, and returns the rotation speeds of the respective pumps 4 and 51 to a rated rotation speed when the detected temperature Tt inside the tank 3 approaches the temperature setpoint SV2.

Moreover, the controller 20 adjusts the temperature of the deionized water in the first circulation loop so that the detected temperature Tt inside the tank 3 is slightly lower than the temperature setpoint SV2, controls the temperature of the deionized water to reach the temperature setpoint SV2 using the heater 52 in the second circulation loop, and subsequently supplies the deionized water to the cleaner 2.

The same actions and effects as those in the first exemplary embodiment are also obtainable by the above deionized water heating device 50.

Fifth Exemplary Embodiment

The deionized water discharge valve 7 is provided to the bottom of the tank 3 in the fourth exemplary embodiment.

A deionized water heating device 60 in the fifth exemplary embodiment is different from the deionized water heating device in the fourth exemplary embodiment in that a deionized water discharge valve 41 is provided in the middle of the pipe 15 located downstream of the heater in the first circulation loop as shown in FIG. 8.

Also in the fifth exemplary embodiment, the same actions and effects as those in the first exemplary embodiment are obtainable.

Moreover, since the deionized water discharge valve 41 is provided in the middle of the return pipe 15 located downstream of the heater 5, the same actions and effects as those in the third exemplary embodiment are obtainable.

Sixth Exemplary Embodiment

The deionized water discharge valve 41 is provided only in the first circulation loop in the fifth exemplary embodiment.

A deionized water heating device 70 in the sixth exemplary embodiment is different from the deionized water heating device in the fifth exemplary embodiment in that the deionized water discharge valve 41 is provided in the first circulation loop and a deionized water discharge valve 71 is provided in the return pipe 54 of the second circulation loop as shown in FIG. 9.

The controller 20 synchronously controls the deionized water discharge valves 41 and 71 to simultaneously discharge the deionized water.

Also in the sixth exemplary embodiment, the same actions and effects as those in the first and third exemplary embodiments are obtainable.

Further, the deionized water discharge valve 71 provided in the second circulation loop allows the deionized water in the second circulation loop to be discharged when the temperature setpoint SV1 is changed to the temperature setpoint SV2 (SV1>SV2). Accordingly, by discharging a higher-temperature deionized water flowing in the circulation loop, the temperature of the heated deionized water in the tank 3 can be effectively lowered.

Modification(s) of Exemplary Embodiment(s)

It should be understood that the scope of the invention is not limited to the above-described exemplary embodiments but includes modifications and improvements as long as the modifications and improvements are compatible with the invention.

Although the temperature setpoint is changed, for instance, using the controller 20 in the third to sixth exemplary embodiments, any controller is usable. In some embodiments, for instance, the controller 30 described in the second exemplary embodiment is used for changing the temperature setpoint.

In the above exemplary embodiments, the fluid heating device of the invention is used as the deionized water heating device configured to heat deionized water. However, the fluid heating device of the invention is usable for heating any fluid. For instance, in some embodiments, the fluid heating device of the invention is applicable for controlling a temperature of chemicals in the cleaner 2 for a semiconductor wafer.

As for the rest of the components, any structures, shapes and the like are usable as the specific structures, shapes and the like of the invention as long as the modifications and improvements are compatible with the invention.

Effects Observation in Simulation

Simulation of the temperature control was conducted to compare a typical method with the first exemplary embodiment in which the temperature setpoint SV1=80 degrees C. was changed to the temperature setpoint SV2=40 degrees C. in the deionized water heating device 1.

In the typical method for changing from the temperature setpoint SV1 to the temperature setpoint SV2 using the deionized water heating device 1, all the heated deionized water in the tank 3 was discharged through the deionized water discharge valve 7, unheated deionized water at a normal temperature was subsequently supplied through the deionized water supply valve 6 to the tank 3, and the heater 5 heated the deionized water. Specifications of the components are as follows.

Maximum output value of heater 5: 192 kW
Circulation flow rate (pump 4): 56 L/min
Capacity of tank 3: 65 L
Temperature of supply deionized water: 24 degrees C.
Flow rate of supply deionized water: 56 L/min
Flow rate of discharge deionized water: 56 L/min In the simulation shown in FIG. 10, after the deionized water is heated to the temperature setpoint SV1=80 degrees C. and kept constant at the temperature setpoint SV1, the temperature setpoint is changed from the temperature setpoint SV1 to the temperature setpoint SV2=40 degrees C. at the elapsed time of 1000 seconds.

In the typical method, after the temperature setpoint is changed, the deionized water in the 65-L tank 3 is discharged and, when the tank 3 is emptied, unheated deionized water is supplied. As shown in FIG. 10, the supply and discharge of the deionized water is conducted in a period of time from 100 seconds to 1140 seconds, the temperature detected by the temperature sensor 14 changes as shown by a graph PV2, and then the deionized water is heated starting from 24 degrees C. to the temperature setpoint SV2=40 degrees C.

In contrast, in the first exemplary embodiment, the supply and discharge of the deionized water simultaneously start at the time of 1000 seconds, in which the heated deionized water in the tank 3 is mixed with unheated deionized water at a normal temperature to be cooled. The supply and discharge of the deionized water continues until the detected temperature Tt inside the tank 3 to be detected by the temperature sensor 9 reaches 38 degrees C. that is lower by 2 degrees C. than the temperature setpoint SV2. As a result, the change of the temperature setpoint of the deionized water in the first exemplary embodiment is completed in a period of 103 seconds that is shorter by 37 seconds than in the typical method. The detected temperature by the temperature sensor 14 changes as shown by a graph PV1. The temperature setpoint SV2 becomes constant at the elapse time of about 1150 seconds. The cooling time can be shortened by about 50 seconds than 200 seconds according to a typical method.

A difference in power consumption in a period of time from 1000 seconds to 1200 seconds between the first exemplary embodiment and the typical method is 17 kW in average. Power consumption in the first exemplary embodiment can be less than in the typical method. This is because almost no electricity is used for heating by the heater 5 during the cooling time in the first exemplary embodiment.

The invention claimed is:

1. A fluid heating device comprising:
a tank configured to store a fluid;
a pump configured to remove the fluid stored in the tank;
a heater configured to heat the removed fluid to a predetermined temperature;

a return pipe configured to return the fluid heated by the heater to the tank;

a fluid supply valve configured to supply an unheated fluid into the tank;

a fluid discharge valve configured to discharge the heated fluid from the tank;

a temperature sensor configured to detect a temperature of the heated fluid; and a temperature controller configured to control an opening degree of each of the fluid supply valve and the fluid discharge valve to thereby control the temperature of the heated fluid, the temperature controller being configured to:

control the opening degree of the fluid discharge valve based on the temperature detected by the temperature sensor, control the opening degree of the fluid supply valve based on the temperature detected by the temperature sensor, and compare a first temperature setpoint of the heated fluid to a second temperature setpoint that is set after the first temperature setpoint has been set, wherein the temperature controller is configured to control the pump such that the pump circulates the fluid at a minimum pumping flow rate based on the second temperature setpoint being less than the first temperature setpoint.

2. The fluid heating device according to claim 1, wherein the temperature controller is further configured to calculate a supply amount of the unheated fluid for decreasing the temperature of the heated fluid to the second temperature setpoint.

3. The fluid heating device according to claim 1, wherein the fluid heating device comprises:

a first circulation loop provided with the pump, the heater, and the return pipe; and a second circulation loop independent of the first circulation loop and configured to supply a part of the heated fluid to a cleaner of a semiconductor wafer and return the rest of the part of the heated fluid to the tank, and wherein the fluid discharge valve is provided in the second circulation loop.

4. The fluid heating device according to claim 1, wherein each of the first temperature setpoint and the second temperature setpoint is set by an operator of the fluid heating device.

5. A fluid heating device comprising:

a tank configured to store a fluid;

a pump configured to remove the fluid stored in the tank;

a heater configured to heat the removed fluid to a predetermined temperature;

a return pipe configured to return the fluid heated by the heater to the tank;

a fluid supply valve configured to supply an unheated fluid into the tank;

a fluid discharge valve provided in the return pipe and located downstream of the heater, the fluid discharge valve being configured to discharge the heated fluid;

a temperature sensor configured to detect a temperature of the heated fluid; and a temperature controller configured to control an opening degree of each of the fluid supply valve and the fluid discharge valve to thereby control the temperature of the heated fluid, the temperature controller being configured to:

control the opening degree of the fluid discharge valve based on the temperature detected by the temperature sensor, control the opening degree of the fluid supply valve based on the temperature detected by the temperature sensor, and compare a first temperature setpoint of the heated fluid to a second temperature setpoint that is set after the first temperature setpoint has been set, wherein the temperature controller is configured to control the pump such that the pump circulates the fluid at a minimum pumping flow rate based on the second temperature setpoint being less than the first temperature setpoint.

* * * * *